(12) United States Patent
Goodner et al.

(10) Patent No.: US 7,572,732 B2
(45) Date of Patent: *Aug. 11, 2009

(54) METHOD TO MODULATE ETCH RATE IN SLAM

(75) Inventors: Michael D. Goodner, Hillsboro, OR (US); Robert P. Meagley, Hillsboro, OR (US); Kevin P. O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 370 days.

This patent is subject to a terminal disclaimer.

(21) Appl. No.: 11/417,615

(22) Filed: May 3, 2006

(65) Prior Publication Data

US 2006/0205221 A1 Sep. 14, 2006

Related U.S. Application Data

(62) Division of application No. 10/715,956, filed on Nov. 17, 2003, now Pat. No. 7,101,798.

(51) Int. Cl.
H01L 21/302 (2006.01)
(52) U.S. Cl. .................. 438/689; 438/706; 438/713; 438/714; 438/673; 438/640; 257/E21.495
(58) Field of Classification Search ................ 438/689, 438/706, 710–714, 725, 637–640, 629, 673
See application file for complete search history.

(56) References Cited

U.S. PATENT DOCUMENTS

| 6,365,529 | B1 | 4/2002 | Hussein et al. |
| 6,448,185 | B1 | 9/2002 | Andideh et al. |
| 7,101,798 | B2 * | 9/2006 | Goodner et al. ............. 438/689 |
| 2002/0175417 | A1 | 11/2002 | Morrow |

FOREIGN PATENT DOCUMENTS

| EP | 0 249 173 A1 | 6/1987 |
| EP | 1 150 343 A2 | 4/2001 |
| WO | WO 01/15211 A1 | 3/2001 |
| WO | PCT/US2004/003775 | 11/2004 |

OTHER PUBLICATIONS

Kennedy, "Organosiloxane Based Bottom Antireflective Coatings for 193nm Lithography", Advances in Resist Technology and Processing XX, Proceedings of SPIE, vol. 5039 (2003), pp. 929-939.
WIPO, "International Search Report and Written Opinion", PCT/US/2004/037725, mailed May 4, 2005, 1-12.
WIPO, "International Preliminary Report on Patentability", PCT/US2004/037725, mailed Jun. 1, 2006, 1-8.

* cited by examiner

*Primary Examiner*—Thanh Nguyen
(74) *Attorney, Agent, or Firm*—Blakely, Sokoloff, Taylor & Zafman LLP

(57) ABSTRACT

Several techniques are described for modulating the etch rate of a sacrificial light absorbing material (SLAM) by altering its composition so that it matches the etch rate of a surrounding dielectric. This particularly useful in a dual damascene process where the SLAM fills a via opening and is etched along with a surrounding dielectric material to form trenches overlying the via opening.

4 Claims, 3 Drawing Sheets

METHOD TO MODULATE ETCH RATE IN SLAM

This is a Divisional Application of Ser. No. 10/715,956 filed Nov. 17, 2003, now U.S. Pat. No. 7,101,798 which is presently pending.

BACKGROUND OF THE INVENTION

The invention relates to the field of semiconductor processing, and in particular, to the etching of a sacrificial light absorbing material (SLAM).

PRIOR ART

In a typical modern integrated circuit, several layers of interconnections are formed above the substrate. In an effort to reduce power consumption and increase speed, it is important that the conductors in these layers have low resistance, and that the dielectric materials in these layers have a low dielectric constant (low k).

Often, to achieve these results, higher conductivity metals such as copper are used, which are more difficult to process than, for instance aluminum. A dual damascene processing is often used to inlay these higher conductivity metals. In one type of dual damascene processing, known as 'via first dual damascene', via openings are first etched in an interlayer dielectric (ILD). Next, trenches are etched above the via openings for the conductive lines in the interconnection layer. During the etching of the trenches, it is necessary that the via openings are filled to prevent, among other problems, over etching of the via openings. The via openings can be filled with a sacrificial light absorbing material (SLAM). The SLAM has the quality of absorbing light during the exposure of the photoresist used to define the masking for the trenches. Ideally, the SLAM should etch at the same rate as the surrounding dielectric material of the ILD to prevent shell and cratering defects which will be discussed later.

DETAILED DESCRIPTION OF THE DRAWINGS

DETAILED DESCRIPTION

In the following description, a method for modulating the etch rate of a sacrificial light absorbing material (SLAM) is described in connection with a dual damascene process. It will be apparent to one skilled in the art that the SLAM may be used in other applications. Moreover, while in the following description, numerous specific details are set forth, such as specific chemistries, the present invention may be practiced without these specific details. In other instances, well-known processing and well-known chemistries have not been described in detail in order not to unnecessarily obscure the present invention.

Figure 1:
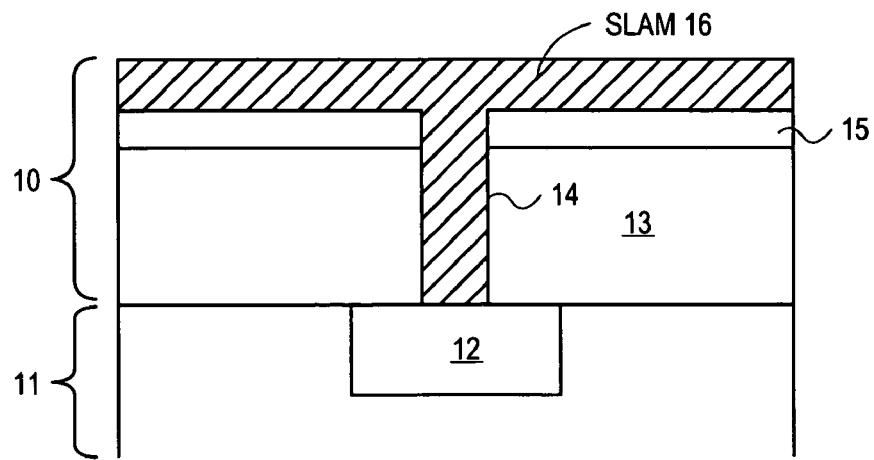
FIG. 1 is a partial cross-sectional, elevation view of an integrated circuit showing a partially fabricated interconnection layer disposed above an underlying interconnection layer. More specifically in FIG. 1, a via opening is shown filled with a SLAM.

Referring first to FIG. 1, a partially fabricated interconnection layer 10 is illustrated having a via opening 14. The opening 14 is filled with a SLAM 16. The interconnection layer 10 is shown formed over an underlying interconnection layer 11 with the via opening 14 landed on a conductor 12. Not illustrated in FIG. 1 are a barrier layer typically surrounding the conductor 12, a cladding layer sometimes used over the conductor 12, and an etch stop layer used between the interconnection layers 10 and 11. The interconnection layer 10 may also be formed on a substrate containing active devices.

To fabricate the interconnection layer 10, first an interlayer dielectric (ILD) 13 is formed on the underlying layer. For example, the dielectric layer may comprise plasma enhanced, chemical vapor deposited (PECVD) silicon dioxide, doped with carbon (CDO). Such a layer may have, for instance, a dielectric constant of approximately 2.2 to 2.6. Other materials that may be used for the dielectric layer include materials such as a fluorinated silicon dioxide or an organic polymer selected from the group that includes polyimides, parylenes, polyarylethers, polynaphthalenes, and polyquinolines or copolymers thereof. Some commercially available polymers are discussed below. By way of example, the dielectric layer has a thickness of between approximately 2,000 and 20,000 Å.

The dielectric layer 13 may comprise two dielectric materials, one having a thickness of approximately equal to the trench that is to be formed with the dual damascene process, and the other a thickness approximately equal to the remaining size of the via after the trench is formed.

Suitable dielectric polymers for these layers include but are not limited to organic polymeric materials such as poly(norbornene), sold under the tradename UNITY™, distributed by Promerus, LLC; cross-linked photoresist; photosensitive polyimide; polyarylene-based dielectrics, sold under the tradenames "SiLK™" and "GX-3™", distributed by Dow Chemical Corporation and Honeywell Corporation, respectively; and poly(aryl ether)-based materials such as that sold under the tradename "FLARE™", distributed by Honeywell Corporation. Other suitable materials include but are not limited to polystyrene, poly(p-phenylene), polyexylene, and cross-linked polymethylmethacrylate ("PMMA"). The via and conductor dielectric layers may be formed using conventional deposition techniques such as spin-on for suitable polymers, conventional chemical vapor deposition (CVD), plasma-enhanced CVD (PECVD), or physical vapor deposition (PVD).

Following the formation of the ILD a hard mask material 15 is formed in some processes. In a first masking operation, an opening for a via is formed through the hard mask 15. Then, the via opening 14 is dry etched using a plasma etching process. A conventional processing method for etching through the dielectric may be used to etch the via opening 14. For instance, a conventional anisotropic dry oxide etch process may be used. This may involve a medium density magnetically enhanced reactive ion etching process (MERIE system) using fluorocarbon chemistry, or a forming gas chemistry (e.g., one including nitrogen and either hydrogen or oxygen).

Now, the SLAM 16 is formed on the hard mask so as to fill the via opening 14. The material, for instance, may be deposited by spin coating, leaving a layer over the hard mask of approximately 500-5,000 Å. The spin coating process causes the SLAM to substantially or completely fill the via opening 14, in addition to the coating left on the hard mask 15. The SLAM material may comprise an organic bottom anti-reflective coating (BARC). These BARC materials are commercially available from several companies. Also, spin-on glass (SOG) based materials may be used such as DUO™, manufactured by Honeywell Electronic Materials.

Figure 2:
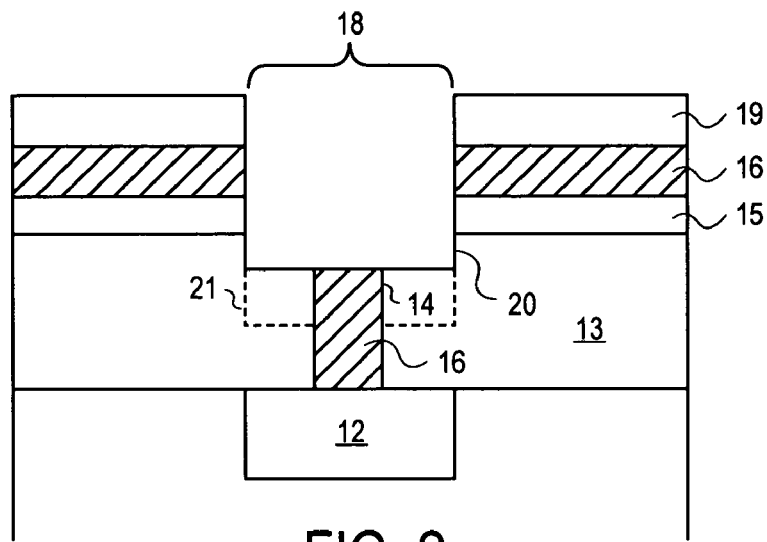
FIG. 2 illustrates the structure of FIG. 1, after a trench has been partially etched.

Referring to FIG. 2, following the formation of the SLAM layer, a photoresist layer 19 is formed and an opening 18 is defined for the trench, which subsequently will be filled with a conductor. Ordinary dry etching is used to define the trench 20 to the depth indicated by the line 21. Then, a wet etch is used to remove the SLAM 16 from the remainder of the via opening, which extends below the bottom of the trench to the conductor 12. If an optional etch stop layer was used between interconnection layers 10 and 11, a wet or dry etch process is then used to remove the etch stop material between the via opening and the conductor 12. Now, ordinary dual damascene processing is used. Typically this involves the formation of a barrier layer in the via opening and trench, the formation of the conductive material filling both the via opening and the trench, and chemical-mechanical polishing (CMP) to remove the conductive material from the upper surface of the ILD.

Figure 3:
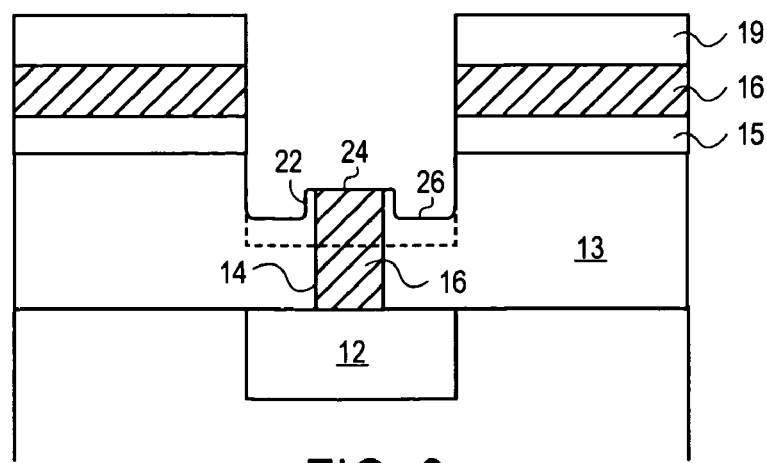
FIG. 3 illustrates the structure of FIG. 2 where a shell defect is occurring because the SLAM etches more slowly than the surrounding dielectric material.

Ideally, as mentioned, the SLAM should etch at the same rate as the dielectric material of the ILD surrounding the SLAM. If the SLAM etches more slowly than the surrounding dielectric material, as illustrated in FIG. 3, a shell 22 may form around the SLAM 24. Note the trench 26 is deeper than the upper level 24 of the SLAM filling the via opening. This can result in a defect in the interconnecting layer.

Figure 4:
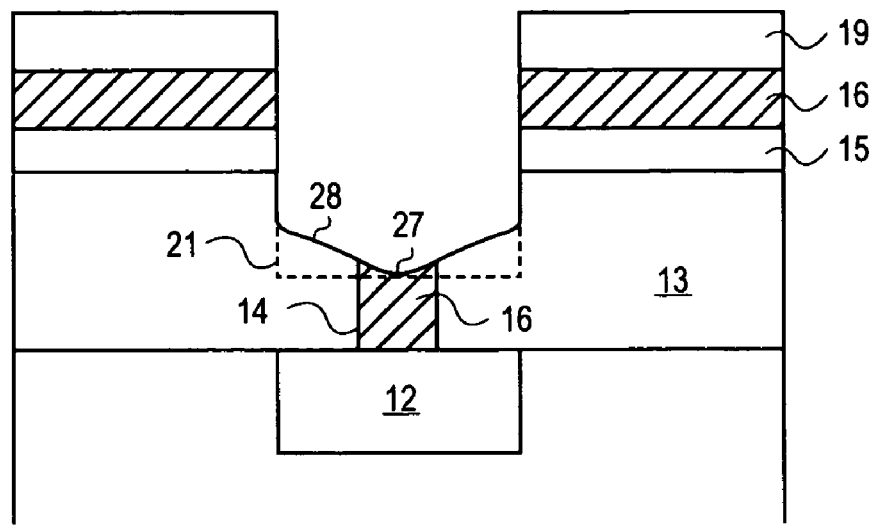
FIG. 4 illustrates the structure of FIG. 2 with the beginning of a trenching defect resulting from the SLAM etching more quickly than the surrounding dielectric material.

In FIG. 4, a somewhat opposite problem is shown, where the SLAM etches more quickly than the surrounding dielectric material. As can be seen, a crater 28 develops since the SLAM material level 27 is lower than the surrounding dielectric material.

Note that FIGS. 3 and 4 are used for purposes of illustration, and in fact, in some cases both a shell and crater are formed or microtrenching occurs where there is a differential etch rate between the SLAM and the surrounding dielectric material.

In the prior art, the etch rates of, for instance, a CDO type ILD and SLAM are matched sufficiently close to prevent defects by modifying the etching conditions themselves. For example, by modifying the etching gases, RF power and chuck temperatures, the differential in etch rates can be minimized. These prior art techniques are proving unsatisfactory as the dielectric materials contain, for instance, greater amounts of carbon or larger void spaces and different dielectric materials are selected.

It is known that the dry etch rate of ILD materials varies as a function of carbon content. It is also known that the etch rate of carbon based materials such as photoresist is greater for aliphatic systems and lower for cyclic, aromatic- and cage containing systems. However, these concepts have not been applied to the SLAM. As will be seen below, the SLAM materials themselves are tailored to match the ILDs.

For related technology see "Removing Sacrificial Material by Thermal Decomposition," Ser. No. 10/287,369, filed Nov. 4, 2002, and "Polymer Sacrificial Light Absorbing Structure and Method," Ser. No. 10/360,709, filed Feb. 8, 2003, both assigned to the assignee of the present invention.

Figure 6:
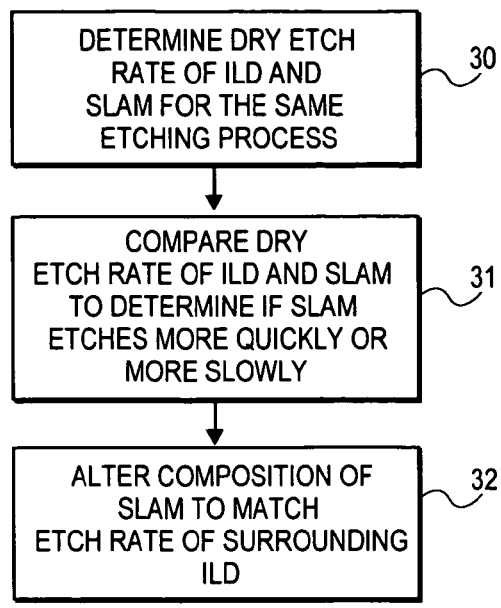
FIG. 6 is an overview of the method employed for modulating the etch rate of the SLAM.

An overview of the processing of the present invention is shown in FIG. 6. First, a determination is made of the dry etch of the ILD. This is shown by block 30 in FIG. 6. This etch rate is a function of a number of variables for any given ILD material, particularly those variables associated with the dry etching process. They include the gas mixture used and the temperature of the chuck, for instance. Also the etch rate of the SLAM (the etch rate before the SLAM is altered as taught below) is determined. This etch rate is determined for the same etching variables as used for the etching of the ILD.

Often, both etch rates are specified for some sets of etching variables by the manufacturer of the ILD and SLAM. In other cases, the etch rate will need to be determined from an actual etching process. In the case of where two dielectric materials are used for the ILD, typically the etch rate of the material for the trench (not the via) is the relevant etch rate.

The two etch rates are compared to determine if the SLAM needs to etch faster or slower to match the etch rate of the ILD. This is shown as block 31 of FIG. 6.

As shown by block 32, the composition of the SLAM is altered such that its etch rate is approximately the same as that of the surrounding ILD. Below, several techniques for modulating the etch rate of the SLAM by altering its composition so that it matches the etch rate of the surrounding ILD are discussed.

Figure 5:
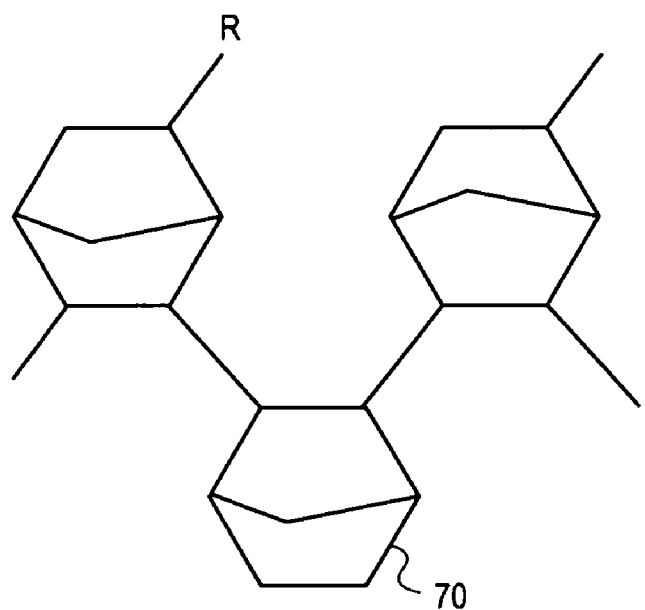
FIG. 5 illustrates one possible molecular structure of a SLAM.

In general it is helpful if the dielectric material of the ILD and the SLAM have same general overall structure. For example, both the ILD and the SLAM may have a polymetric backbone 70 shown in FIG. 5. For example, the SLAM and dielectric may comprise a poly (norbornene) backbone element 70. The material comprising the SLAM however, preferably includes a side group "R" which is added and/or changed to allow the modulation of the SLAM etch rate. By way of example, R may be a aromatic or cage moiety (such as adamantyl) for decreasing the etch rate or a fluorine-containing moiety (such as $CF_3$ or $C_2F_5$) for increasing the etch rate.

In general, for a polymer based SLAM, several techniques can be used to alter the etch rate. First, the carbon-to-silicon ratio of the SLAM can be increased to reduce the etch rate in etch typical etch processes used for silicon dioxide or CDO ILD materials. This situation is typically what will occur when the carbon content of, for instance, a CDO is increased in a given fabrication process to lower k in the ILDs, which results in the CDO ILD etching slower than the SLAM. Thus, increasing the carbon content of the SLAM will reduce the SLAM etch rate in such a way that the ILD and SLAM etch rates may be matched. Alternatively, if the dry etching process is changed by, for instance, changing the etchant gases, resulting in an ILD etch rate faster than the SLAM etch rate, it is desirable to increase the etch rate of the SLAM to match the etch rate of the ILD. In this instance, it is prudent to reduce the carbon-to-silicon ratio of the SLAM to make the SLAM etch more quickly in the new etch process conditions. Note that these trends hold in etch conditions in which carbonaceous materials etch slower that silicon-based materials. However, in etch conditions in which silicon-based materials etch slower, the opposite relationship should be employed (increasing carbon content to increase etch rate, reduce carbon content to reduce etch rate).

Another method to decrease the etch rate of the SLAM is to introduce carbon in a cyclic, aromatic or caged form. The multiply-bonded carbon has the effect of decreasing the etch rate in many well characterized etch processes. Alternatively, if the SLAM already contains carbon in a cyclic, aromatic or caged form, the concentration of these moieties may be decreased to have the effect of increasing the etch rate.

The introduction of fluorine atoms or fluorine containing functional groups directly into the backbone of the SLAM will serve to increase dry etch rate. Thus referring to FIG. 5, fluorine may be introduced into the backbone 70 or may be part of the side group "R." In this connection, as the SLAM is etched, fluorine radicals are generated, which are then energized to serve as an additional high energy etchant in situ. Alternatively, if reduction in etch rate is desired the fluorine content may be decreased in the SLAM.

The introduction of fluorine-containing additives in the sacrificial material formulation will also increase the dry etch rate in the same manner as adding fluorine directly to the sacrificial material. In this case, if a fluorinated surfactant is used to promote spin-coating uniformity, the concentration may increased, or additional additives (such as low molecular weight polyvinylidene fluoride or perfluoropolyethers) may be included to serve as a fluorine source. Alternatively, if reduction in etch rate is desired the fluorine content may be decreased in the material. Note that while these techniques refer specifically to fluorine, other halogens, such as chlorine, may be similarly utilized to have the same effect on the etch rate of the SLAM.

Figure 7:
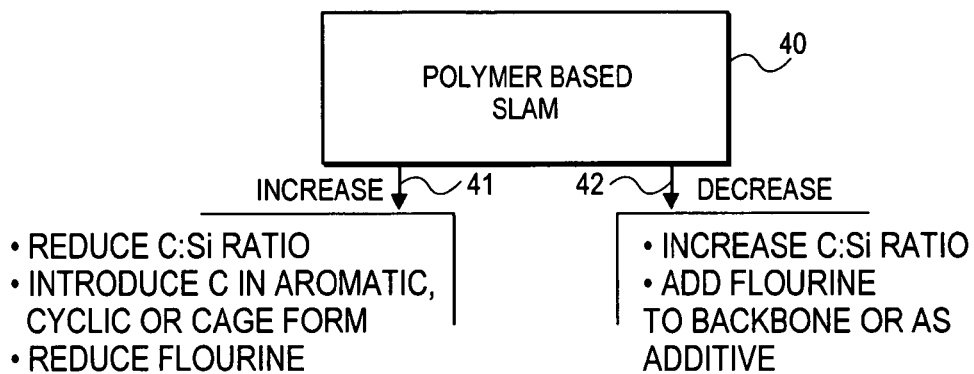
FIG. 7 illustrates methods for modulating the etch rate of a polymer-based SLAM.

Referring to FIG. 7, for the polymer based SLAM 40 methods that can increase and decrease the etch rate are shown. To increase etch rate as shown at 41, the carbon-to-silicon ratio can be reduced. Additionally, fluorine can be added to the backbone side group or as an additive. As shown at 42 the polymer-based SLAM etch rate can be decreased by increasing the carbon-to-silicon ratio. Decrease in the dry etch rate can also be obtained by introducing carbon in, for instance, the aromatic form, or in a cyclic or caged form.

If on the other hand, the SLAM material is a siloxane-based system, several of the above discussed techniques may also be used. The introduction of carbon in the cyclic, aromatic or caged form in the SLAM will have the effect of decreasing the etch rate in many etch processes. However, if the SLAM already contains carbon in a cyclic, aromatic or caged form, the concentration of these moieties may be decreased to have the effect of increasing the etch rate. Fluorine atoms or fluorine containing functional groups can be added to the SLAM backbone, which will serve to increase the dry etch rate. Also, fluorine containing additives may be introduced in the sacrificial material to increase the dry etch rate. Again, the fluorine radicals generated as etching occurs, serve as additional etchants. Fluorine, as in the case of the polymer-based SLAM, can be decreased in the SLAM to decrease its etch rate.

Figure 8:
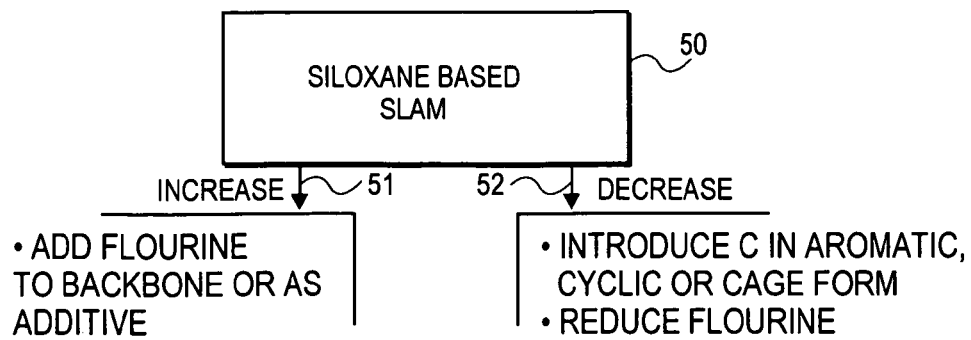
FIG. 8 illustrates methods used for modulating the etch rate of a siloxane-based SLAM.

For siloxane-based SLAM 50 as shown in FIG. 8, an increased etch rate is shown at 51. This includes the addition of fluorine to the backbone or as an additive. At 52, the decrease in etch rate is shown by introducing carbon in an aromatic cyclic or caged form. Also, the fluorine content can be decreased to reduce the dry etch rate. Thus, several methods of altering the composition of a SLAM have been described that modulate the etch rate of a SLAM so that it matches the etch rate of the surrounding dielectric material.

What is claimed is:

1. A method comprising:
    altering an amount of a fluorine-containing additive of a SLAM composition to provide a changed dry etch rate for the SLAM such that the changed etch rate of the altered SLAM is approximately equal to a dry etch rate of an interlayer dielectric (ILD) material, wherein altering the amount of a fluorine-containing additive comprises adding a low molecular weight polyvinyldene;
    forming a via opening in a layer fabricated from the ILD material;
    filling the via opening with the altered SLAM; and
    etching a trench approximately centered on the via opening such that the ILD material and the SLAM etch at the same rate.

2. The method defined by claim 1, wherein the ILD material is a carbon doped oxide.

3. The method defined by claim 1, wherein the ILD material is a polymer based material.

4. A method comprising:
    altering an amount of a fluorine-containing additive of a SLAM composition to provide a changed dry etch rate for the SLAM such that the changed etch rate of the altered SLAM is approximately equal to a dry etch rate of an interlayer dielectric (ILD) material, wherein altering the amount of a fluorine-containing additive comprises adding a perfluoropolyether;
    forming a via opening in a layer fabricated from the ILD material;
    filling the via opening with the altered SLAM; and
    etching a trench approximately centered on the via opening such that the ILD material and the SLAM etch at the same rate.

* * * * *

UNITED STATES PATENT AND TRADEMARK OFFICE
CERTIFICATE OF CORRECTION

PATENT NO. : 7,572,732 B2
APPLICATION NO. : 11/417615
DATED : August 11, 2009
INVENTOR(S) : Goodner et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 470 days.

Signed and Sealed this

Seventh Day of September, 2010

David J. Kappos
*Director of the United States Patent and Trademark Office*